(12) United States Patent
Nakano et al.

(10) Patent No.: US 7,020,322 B2
(45) Date of Patent: Mar. 28, 2006

(54) COMPONENT-MOUNTING METHOD AND COMPONENT-MOUNTING APPARATUS

(75) Inventors: Tomoyuki Nakano, Kofu (JP); Koji Odera, Kofu (JP); Takeshi Kuribayashi, Yamanashi-ken (JP); Kazuo Kido, Kofu (JP)

(73) Assignee: Matsushita Electric Industrial Co., Ltd., Osaka-fu (JP)

( * ) Notice: Subject to any disclaimer, the term of this patent is extended or adjusted under 35 U.S.C. 154(b) by 668 days.

(21) Appl. No.: 10/003,831

(22) Filed: Dec. 6, 2001

(65) Prior Publication Data

US 2002/0071602 A1 Jun. 13, 2002

(30) Foreign Application Priority Data

Dec. 8, 2000 (JP) ............................. 2000-374428

(51) Int. Cl.
*G06K 9/00* (2006.01)
*H01L 23/544* (2006.01)
(52) U.S. Cl. ........................ 382/145; 382/149; 382/151; 438/16; 348/87; 257/E23.179; 356/237.1
(58) Field of Classification Search ........ 382/141–152; 438/16, 5, 14, 400; 348/87; 29/833; 257/E23.179; 250/559.01–559.03; 356/237.1–237.6
See application file for complete search history.

(56) References Cited

U.S. PATENT DOCUMENTS

| | | | | |
|---|---|---|---|---|
| 5,084,959 A | * | 2/1992 | Ando et al. ................... | 29/740 |
| 5,249,356 A | * | 10/1993 | Okuda et al. ................. | 29/833 |
| 5,256,578 A | * | 10/1993 | Corley et al. ................ | 438/17 |
| 5,547,537 A | * | 8/1996 | Reynolds et al. ............. | 156/351 |
| 5,851,848 A | * | 12/1998 | Balamurugan ................ | 438/33 |
| 5,911,456 A | * | 6/1999 | Tsubouchi et al. ............ | 29/833 |
| 5,983,490 A | * | 11/1999 | Sakemi ........................ | 29/833 |

(Continued)

FOREIGN PATENT DOCUMENTS

EP 1 054 584 11/2000

(Continued)

OTHER PUBLICATIONS

Patent Abstracts of Japan, entitled *"Electronic Component Mounting Method on Multiply Formed Boards"*, vol. 1999, No. 05, May 31, 1999 & JP 11-040999 A (Matsushita Electric Ind. Co., Ltd.) Feb. 12, 1999.

(Continued)

*Primary Examiner*—Bhavesh M. Mehta
*Assistant Examiner*—Aaron Carter
(74) *Attorney, Agent, or Firm*—Wenderoth, Lind & Ponack, L.L.P.

(57) ABSTRACT

A number of recognition operations for a circuit-formed substrate as a whole is reduced by concurrently recognizing a bad mark and an individual substrate mark in the course of a recognition process of a single or a plurality of individual substrate(s) provided by sectioning the circuit-formed substrate. Results of the recognition of an inclination and dislocation of the circuit-formed substrate are used to control a position of a substrate-recognition camera which recognizes the individual substrate, thereby reducing a rate of occurrence of recognition errors. When a component of recognition marks or the individual substrate mark is captured within a visual field of the substrate-recognition camera, a position of a corresponding one of these recognized marks is specified, and such a mark is again recognized, and thus, the occurrence of a recognition error can be inhibited.

4 Claims, 9 Drawing Sheets

U.S. PATENT DOCUMENTS

| | | | | |
|---|---|---|---|---|
| 5,992,013 | A | * 11/1999 | Morita | 29/833 |
| 6,016,358 | A | * 1/2000 | Balamurugan | 382/151 |
| 6,079,098 | A | * 6/2000 | Soellner et al. | 29/832 |
| 6,216,341 | B1 | * 4/2001 | Nakahara | 29/833 |
| 6,410,927 | B1 | * 6/2002 | Pike | 250/491.1 |
| 6,457,232 | B1 | * 10/2002 | Isogai et al. | 29/833 |
| 6,546,985 | B1 | * 4/2003 | Aoki | 156/363 |

FOREIGN PATENT DOCUMENTS

| | | |
|---|---|---|
| JP | 04 109699 | 4/1992 |
| JP | 05 267899 | 10/1993 |
| JP | 06 300523 | 10/1994 |
| JP | 09 005022 | 1/1997 |
| JP | 11 040999 | 2/1999 |
| JP | 2000 277991 | 10/2000 |

OTHER PUBLICATIONS

Patent Abstracts of Japan, entitled "*Components Mounting Device*", vol. 016, No. 352 (E-1241), Jul. 29, 1992 & JP 04 109699 A (Sanyo Electric Co., Ltd.) Apr. 10, 1992.

* cited by examiner

COMPONENT-MOUNTING METHOD AND COMPONENT-MOUNTING APPARATUS

BACKGROUND OF THE INVENTION

The present invention relates to a method for mounting components such as electronic components, and the like on a circuit-formed substrate such as an electronic circuit board, and a component-mounting apparatus for performing this component-mounting method.

Figure 6:
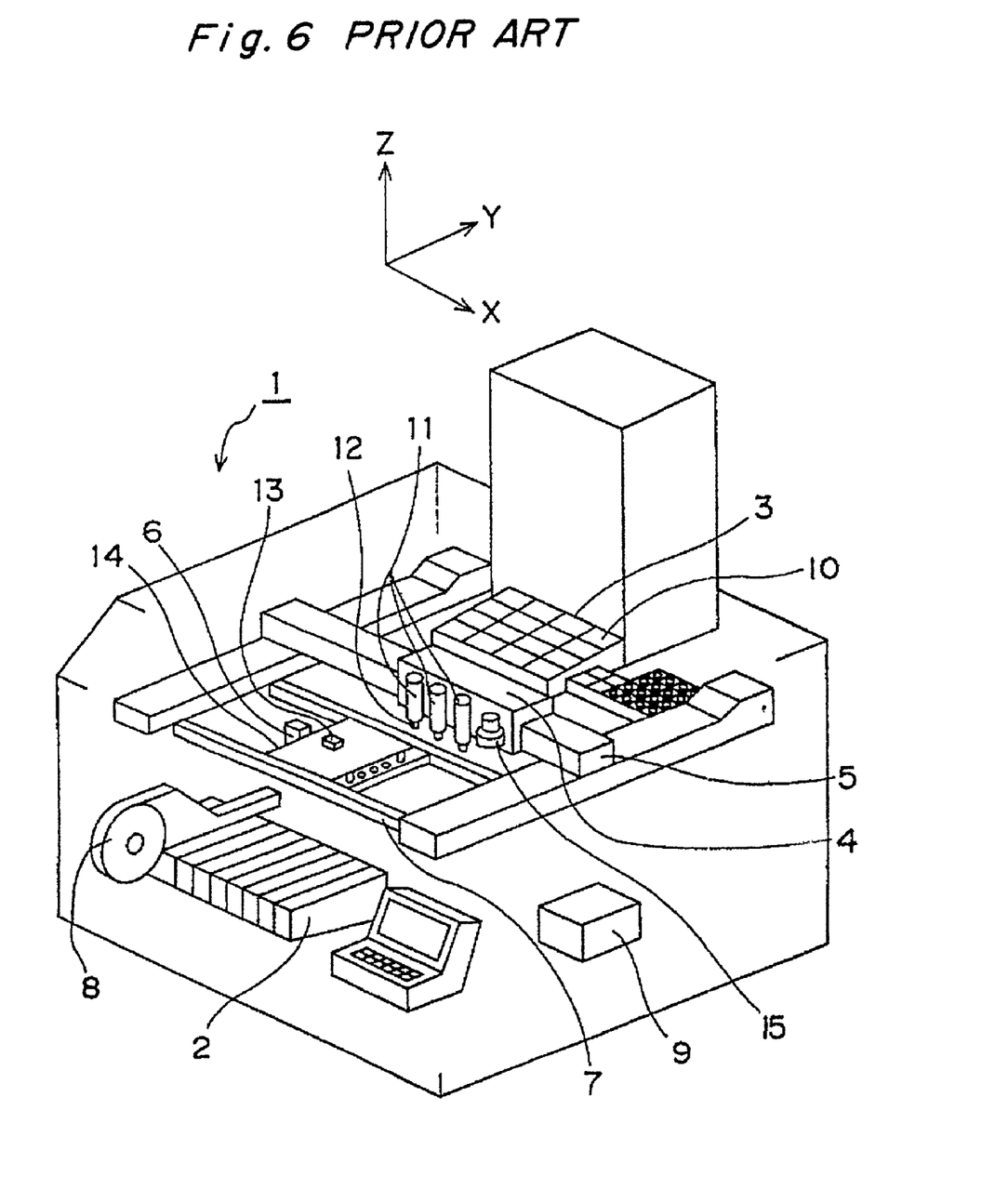
FIG. 6 is a perspective view of a conventional component-mounting apparatus.

FIG. 6 shows an outline of a conventional component-mounting apparatus (1) in its entirety. In FIG. 6, the component-mounting apparatus (1) comprises, as main components: a component-feeding unit (2) composed of a cassette type component-feeding device for feeding components such as electronic components or the like; a tray-feeding unit (3) composed of a tray type component-feeding device; a mounding head (4) equipped with a plurality of nozzles for taking components out of both feeding units (2, 3) and mounting them onto a circuit-formed substrate; an XY robot (5) for carrying the mounting head (4) to a predetermined position; a component-recognition camera (6) for recording and recognizing a condition of a component held by a nozzle of the mounting head (4); a circuit-formed substrate-securing device (7) for carrying the circuit-formed substrate to the component-mounting apparatus (1) and securing the same; and a control unit (9) for controlling operations of the component-mounting apparatus in its entirety.

With reference to FIG. 6, a cassette type component-feeding device (8) having a reel, onto which a lot of components are tape-like wound up, is set on the component-feeding unit (2). A tray pallet type component-feeding device (10), on which a lot of components are arrayed, is set on the tray-feeding unit (3). The mounting head (4) is equipped with nozzle heads (11) each having a nozzle (12) for sucking and removing a component (13) from the component-feeding unit (2) or the tray-feeding unit (3). An angle of each nozzle (12) can be corrected by rotating the nozzle on an axis Z by use of a rotation-controlling mechanism (0 rotation). The X-Y robot (5) carries the mounting head (4) on a plane in X- and Y-directions. The circuit-formed substrate-securing device (7) carries and secures the circuit-formed substrate (14) such as an electronic circuit substrate or the like. The mounting head (4) is equipped with a substrate-recognition camera (15) for recording and recognizing a condition of the circuit-formed substrate when secured.

The component-mounting apparatus (1) thus constructed is operated as follows. The mounting head (4) moves just above a component (13) fed by the component-feeding unit (2) or the tray-feeding unit (3), and causes each of the nozzles (12) to lower such that one of the nozzles contacts and sucks the component (13) and removes it from the component-feeding unit (2) or the tray-feeding unit (3), utilizing a negative pressure. Next, the mounting head (4), sucking and holding the component (13) with the one of the nozzles (12), is carried by the X-Y robot (5) to a position facing to the component-recognition camera (6). The component-recognition camera (6) records and recognizes the component (13) sucked and held by nozzle (12) of the mounting head (4) while the mounting head (4) is passing through a position facing the component-recognition camera (6) at a predetermined speed. An inclination of the component (13) and a dislocation of a position thereof are measured based on a result of the above recognition.

The circuit-formed substrate (14) is carried by the circuit-formed substrate-securing device (7) and then regulated and secured at a predetermined position. When the mounting head (4) is moved to a position facing the circuit-formed substrate (14), the substrate-recognition camera (15) provided on the mounting head (4) records and recognizes the circuit-formed substrate (14). An inclination or dislocation of the circuit-formed substrate (14) is measured based on a result of this recognition. The control unit (9) sends, to each of the nozzle heads (11) mounted on the mounting head (4), a correction amount of the position and inclination of the component (13) based on the position, inclination and dislocation of the circuit-formed substrate (14). The nozzle head (11) of the one nozzle corrects a position and inclination of the component (13) according to this instruction, and then mounts the component (13) at a predetermined position on the circuit-formed substrate (14).

Figure 7A:
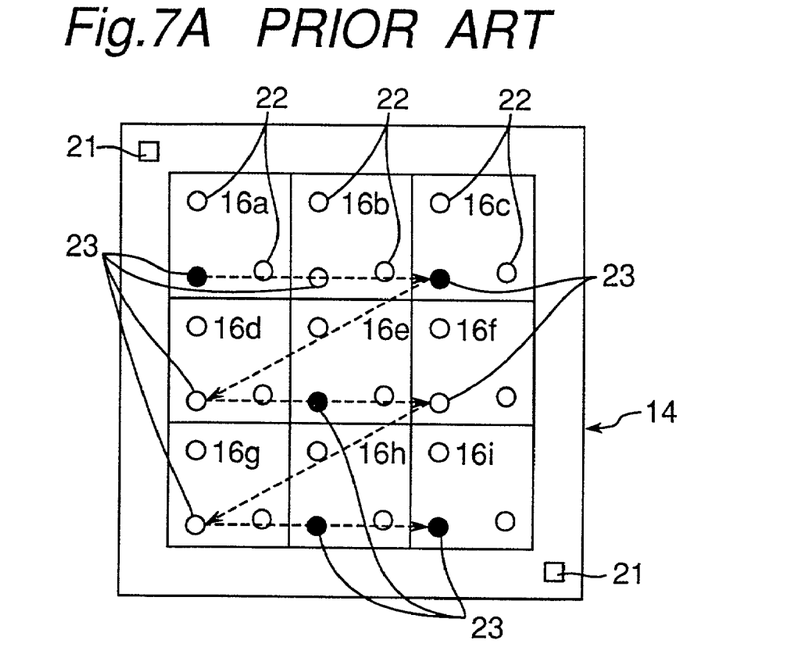
FIGS. 7A and 7B are plan views of a conventional circuit-formed substrate, illustrating an example of process of recognition thereof.

FIG. 7A is a view through the substrate-recognition camera (15) provided on the mounting head (4), showing a condition of the circuit-formed substrate (14) when regulated and secured. In this regard, one sheet of circuit-formed substrate (14) may compose a single electronic circuit substrate. However, in association with recent electronic devices with small sizes and light weight, downsizing of electronic circuit substrates is demanded, and thus, in many cases, a single circuit-formed substrate (14) is sectioned to provide a plurality of electronic circuit substrates as shown in FIG. 7A. In the example shown in FIG. 7A, the circuit-formed substrate (14) is sectioned for nine individual substrates (16a) to (16i) which are arrayed in three rows and three columns. It may be sectioned for more individual substrates, for example, several tens of substrates. In the present specification, one entire sheet with an original size is referred to as the circuit-formed substrate (14), and any of specified and individual substrates (16a) to (16i) is denoted by using an individual reference number or notation. Further, when not a specified individual substrate but a plurality of individual substrates provided from one circuit-formed substrate are generally referred to, such individual substrates are called individual substrates (16).

As shown in FIG. 7A, generally, a pair of reference marks (21) are provided at and around corners on a diagonal line of the circuit-formed substrate (14). The substrate-recognition camera (15) recognizes both reference marks (21) of the circuit-formed substrate (14) while being regulated and secured by the circuit-formed substrate-securing device (7), and an inclination of the circuit-formed substrate (14) and dislocation of a position thereof are measured based on a result of this recognition. The inclination of the circuit-formed substrate (14) and the dislocation of the position thereof are included in correction amounts for the inclination of the component (13) and the dislocation of the position thereof when the component (13) is mounted.

On the other hand, generally, a pair of individual substrate marks (22) are provided at and around corners of a diagonal line of each of the individual substrates (16). The component (13) itself becomes smaller in association with downsizing of electronic devices as mentioned above, and thus, a component-mounting density becomes higher. Therefore, it is required to accurately mount components at predetermined positions without any interference from other components which have already been mounted. The individual substrate marks (22) are used to perform accurate positioning of components on each individual substrate (16).

In addition to the individual substrate marks (22), a position for indicating a bad mark (23) is provided on the individual substrate (16). If some factors for failure, such as incorrect mounting or non-mounting, occur on a specified individual substrate (16) during any step of a process of mounting components onto the circuit-formed substrate (14), a bad mark (23) is indicated on a relevant individual substrate (16). Generally, an operator or an automatic machine provides a bad mark (23) by coloring it using black ink or the like when finding a failure in the course of an intermediate inspection step or the like. This bad mark (23) is recognized by the substrate-recognition camera (15) based on an occupation ratio of brightness (white and black are grasped based on their proportion by a binary value level). An individual substrate (16) attached with the bad mark (23) does not undergo a later component-mounting process so as to save useless consumption of components and loss of tact time.

Figure 7B:
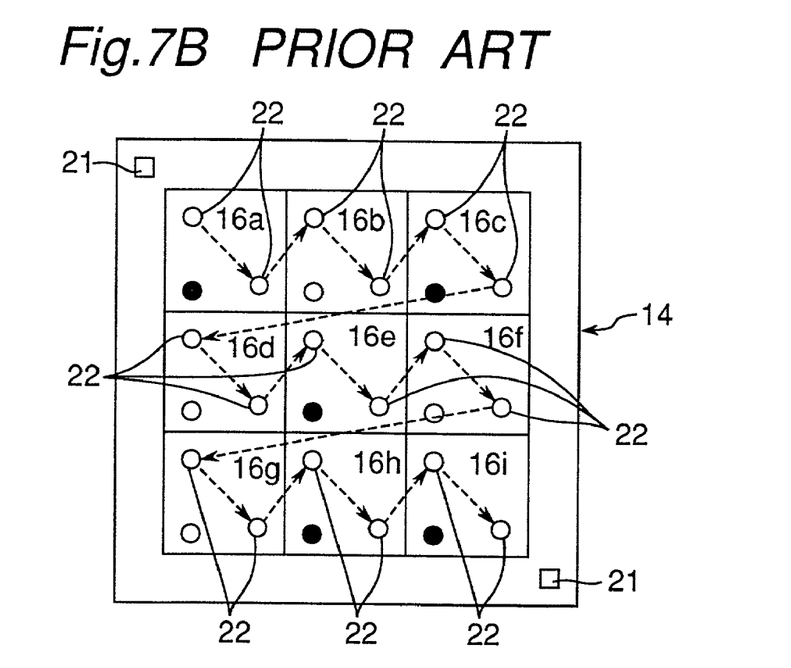

Arrows of a broken line shown in FIG. 7A indicate a passage along which the substrate-recognition camera (15) recognizes bad marks (23). This recognition passage starts from a recognition of bad mark (23) on individual substrate (16a), followed by bad marks (23) on other individual substrates (16b, 16c) in the same row, further followed by bad mark (23) on individual substrate (16d) in a next row, and the recognition is performed in the same manner up to final individual substrate (16i). In the example shown in FIG. 7A, bad marks (23) are put on the individual substrates (16a, 16c, 16e, 16h, 16i), respectively. FIG. 7B shows a passage of recognizing the individual substrate marks (22) after recognition of the bad marks (23). Also, in this recognition passage, as indicated by arrows of broken lines, first, a pair of individual substrate marks (22) of the individual substrate (16a) are recognized, followed by individual substrate marks (22) of the individual substrates (16b) to (16i) in order.

Figure 8:
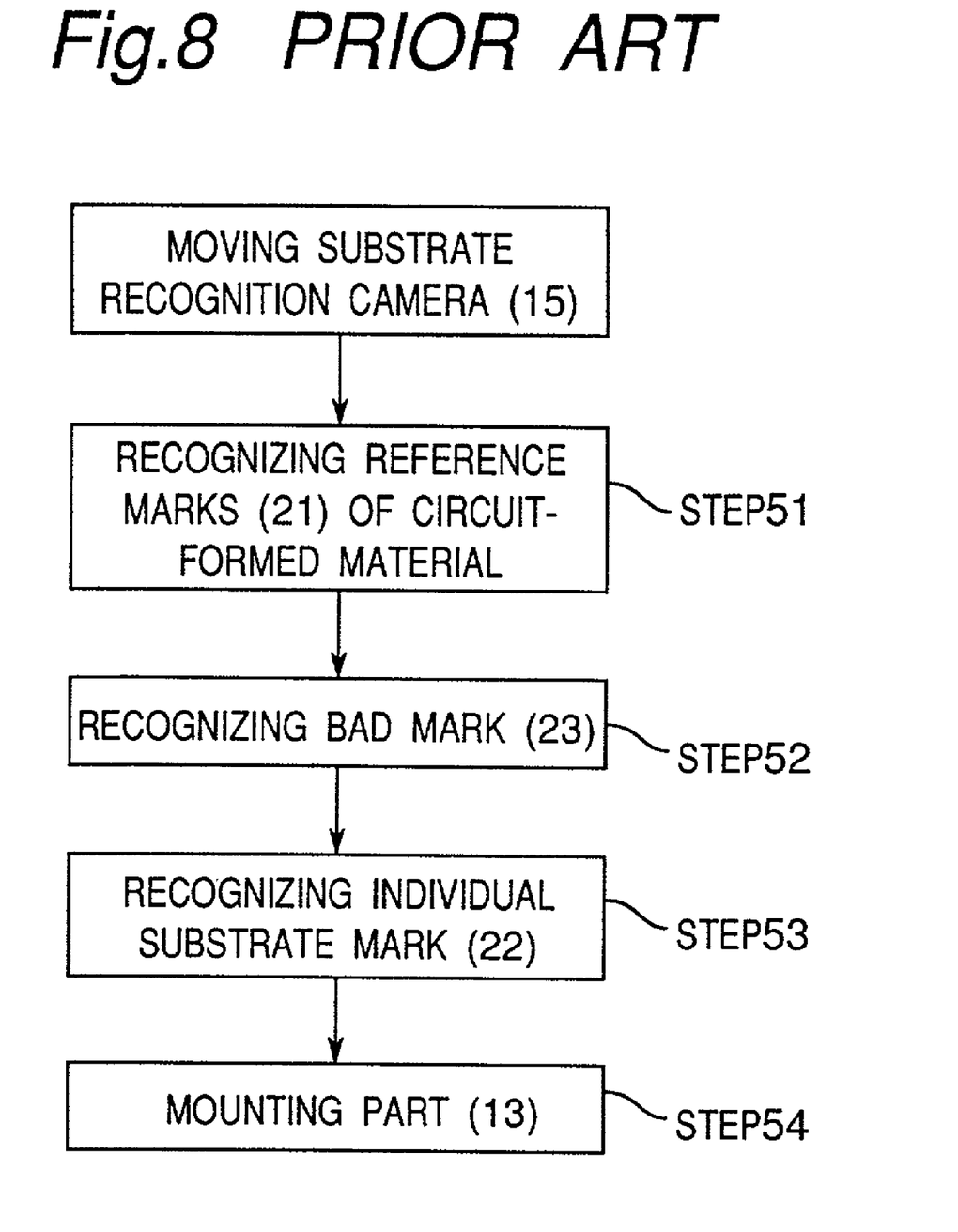
FIG. 8 is an operational flowchart of the process of recognition of the circuit-formed substrate shown in FIGS. 7A and 7B.

FIG. 8 shows a flowchart of a recognition operation performed by the substrate-recognition camera (15). In FIG. 8, the substrate-recognition camera (15) is moved to a position facing the circuit-formed substrate (14) in accordance with movement of the mounting head (4), and the substrate-recognition camera (15) first recognizes the reference marks (21) at two positions of the circuit-formed substrate (14) at Step 51. During an actual recognition operation, the substrate-recognition camera (15) first takes up an image of reference mark (21) at a first point into CCD. This image is inputted to the control unit (9) and stored therein. Next, the camera (15) recognizes an image of reference mark (21) at a second point and takes it into CCD and inputs this image to the control unit (9) and stores it therein. An inclination of the circuit-formed substrate (14) and a dislocation of a position thereof are measured based on a result of recognition of both reference marks (21) at the two points. Next, at Step 52, the camera (15) sequentially recognizes the bad marks (23) on the individual substrates (16) provided by sectioning the circuit-formed substrate (14) (nine total points in the example shown in FIGS. 7A and 7B). As mentioned above, data of the individual substrates (16) on which the bad marks (23) have been recognized are inputted to the control unit (9) so as not to undergo a later component-mounting step.

Next, at Step 53, the substrate-recognition camera (15) sequentially recognizes paired individual substrate marks (22) on overall individual substrates (16) provided by sectioning the circuit-formed substrate (14) (eighteen points in total in the example shown in FIGS. 7A and 7B). Results of this recognition of the individual substrate marks (22) are inputted to the control unit (9) so as to be reflected on correction amounts for an inclination and a position of a component to be mounted during a later component-mounting step. After that, the component-mounting operation is performed at Step 54, and the components (13) sucked by each of the nozzles is mounted on a predetermined position of each of the individual substrates (16).

However, the conventional component-mounting method as mentioned above has problems as follows. That is, during the operation of recognizing the individual substrates (16), first, recognition of the bad marks (23) is performed (Step 52 of the flowchart shown in FIG. 8), followed by recognition of the individual substrate marks (22) (Step 53 of the same flowchart), and therefore, many recognition operations as a whole are required, and much time is required for performance of these many recognition operations, which may adversely influence a case of a circuit-formed substrate (14) which is sectioned into several tens of individual substrates. For example, in case of a circuit-formed substrate (14) sectioned into seventy-seven individual substrates, as many as two hundred thirty one recognition operations in total are required for a single circuit-formed substrate (14).

Figure 9:
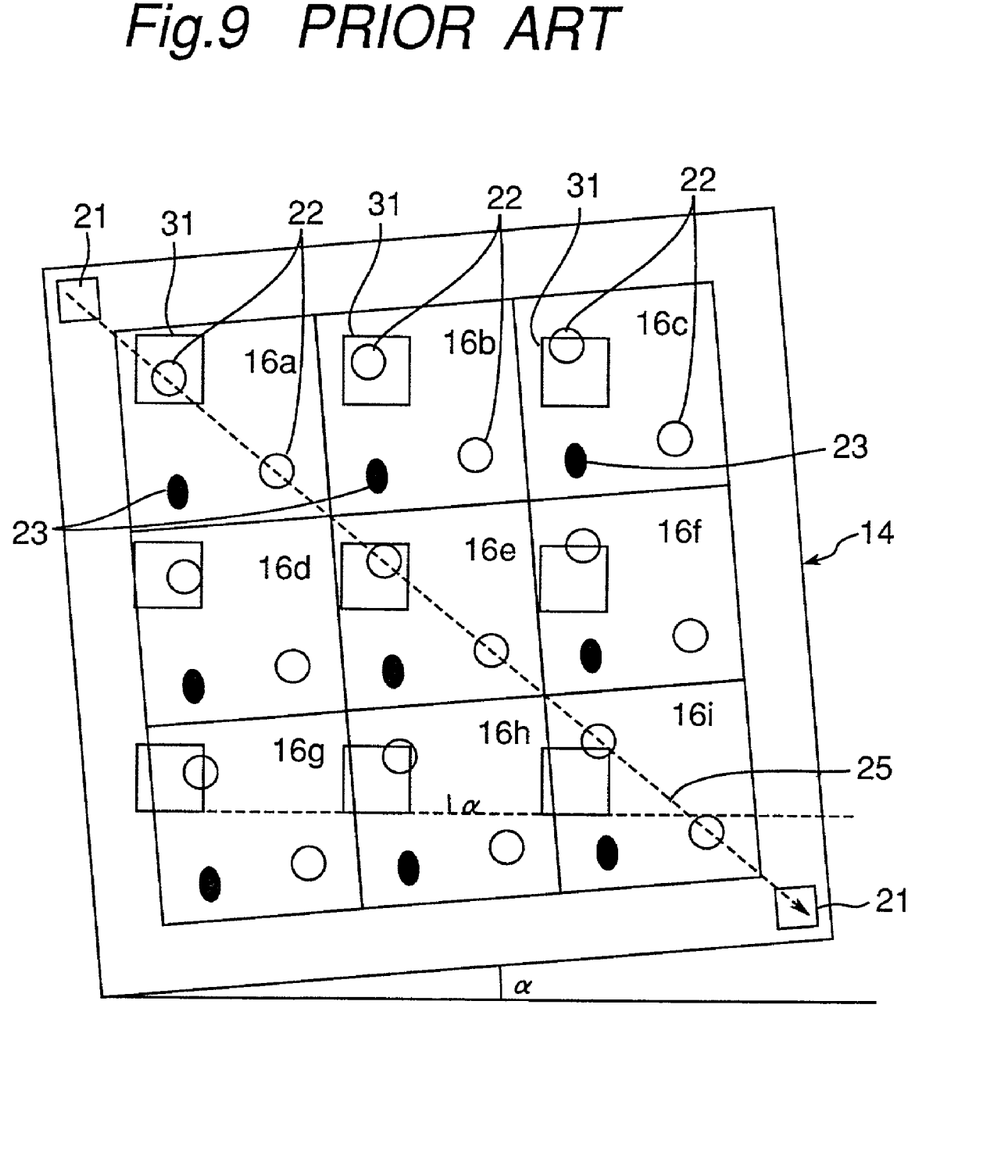
FIG. 9 is a plan view of a conventional circuit-formed substrate, illustrating problems associated with the process of recognition of the circuit-formed substrate.

Next, the inclination of the circuit-formed substrate (14) and dislocation of the position thereof are recognized based on results of recognition of a pair of reference marks (21) on the circuit-formed substrate (14), and results of this recognition are used in calculation of correction amounts for inclination of component (13) and a position thereof. However, a recognition error may occur in the course of the operation of recognizing the individual substrate marks (22) on each of the individual substrates (16), depending on a degree of inclination of the circuit-formed substrate (14), and thus, in some cases, a result of recognition of the reference marks (21) of the circuit-formed substrate is not effectively utilized. FIG. 9 shows one of such situations, in which, as indicated by an arrow of broken line (25), a pair of reference marks (21) of the circuit-formed substrate (14) is first recognized by the substrate-recognition camera (15), and the inclination of the circuit-formed substrate (14) and dislocation of the position thereof are measured based on results of this recognition. These results are used for calculation of correction amounts for the inclination of a component (13) to be mounted and dislocation of the position thereof.

In review of each of the individual substrates (16), for example, recognition of the individual substrate marks (22) of the individual substrates (16a, 16b) has no failure because the individual substrate marks (22) of the individual substrates (16a, 16b) are included in visual field (31) of the substrate-recognition camera (15). In contrast, for example, in case of individual substrate (16c), a component of individual substrate mark (22) indicated by a circle is excluded from the visual field (31) of the camera (15) indicated by a square, which results in a recognition error. Such recognition errors similarly occur in case of the individual substrates (16f, 16g, 16h, 16i). If such a recognition error occurs, the following process may be optionally determined. However, correction amounts for the inclination and position of a component (13) cannot be determined if such a recognition error is left unresolved. Therefore, the individual substrates (16) having such recognition errors have conventionally been judged as defectives. The individual substrates (16) judged as defectives are not subjected to a following component-mounting step. In other words, the individual substrates (16) which may be originally non-defectives are judged as defectives and are scrapped, depending on inclination of the circuit-formed substrate (14).

To solve the problem induced by the above recognition error, it is proposed to widen the visual field of the substrate-recognition camera (15). However, this solution has a problem in that, generally, resolution of the camera degrades if the visual field of the camera is widened, which leads to a further problem in that tact time becomes longer because recognition of an individual substrate requires a longer time. In addition, there is a danger of degrading accuracy of recognition determined by an occupation rate of brightness mentioned above, because, by widening the visual field of the camera (15), other factors may be included in the visual field of the camera (15) and because such factors may be recognized by mistake. At present, on the contrary, there is a tendency of narrowing the visual field of a recognition camera to improve resolution of the camera and to thereby reduce recognition time, so as to improve production efficiency. However, narrowing the visual field means more frequent occurrence of the foregoing recognition errors, which leads to a decrease in a yield of non-defectives.

Objects of the present invention are, therefore, to provide a component-mounting apparatus which is free from the above problems during recognition operations of the circuit formed substrate (14) of the conventional apparatus, and which can perform efficient recognition operations to increase a yield of non-defectives and to thereby improve productivity, and to provide a component-mounting method.

SUMMARY OF THE INVENTION

The present invention provides a method of mounting a component, which comprises steps of: recognizing a bad mark which is indicated on a circuit-formed substrate when each of at least one individual substrate provided by sectioning the circuit-formed substrate includes a defective individual substrate, and recognizing an individual substrate mark which is provided on the circuit-formed substrate so as to recognize a position and an inclination of each of at least one individual substrate as above; and mounting a component onto the circuit-formed substrate, aiming at an individual substrate having no bad mark indicated; and the invention is characterized in that the bad mark is indicated on the individual substrate mark. This method is effective to improve efficiency of a recognition operation by using the individual substrate mark also as the bad mark.

Another aspect of the present invention provides a method for mounting a component, which comprises steps of: recognizing a condition of a sucked component which is fed by a component-feeding device, sucked and removed therefrom; recognizing a condition of a secured circuit-formed substrate which is carried, regulated and secured; recognizing a position and an inclination of at least one individual substrate provided by sectioning the circuit-formed substrate; calculating correction amounts for a position and inclination of the component, which is to be mounted, based on a result of recognition of the component-sucking condition, a result of recognition of the circuit-formed substrate-securing condition, and a result of recognition of the position and inclination of the individual substrate; and making necessary correction on the component based on the result of the above calculation, and mounting the component at a predetermined position on the individual substrate; and the invention is characterized in that a mark which is provided on the individual substrate so as to recognize the position and inclination of the individual substrate is used also as a bad mark for discriminating a defective individual substrate. This method is effective to reduce a number of the recognition operations performed by the substrate-recognition camera, by using the individual substrate mark also as the bad mark.

Another aspect of the present invention is characterized in that the bad mark is indicated by coloring the individual substrate mark of an individual substrate which is judged as a defective before mounting a component.

Another aspect of the present invention provides a method for mounting a component, which comprises steps of: recognizing a condition of a sucked component which is fed from a component-feeding unit, sucked and removed therefrom; recognizing a condition of a secured circuit-formed substrate which is carried, regulated and secured; recognizing a position and inclination of at least one individual substrate provided by sectioning the circuit-formed substrate; calculating correction amounts for a position and inclination of the component, which is to be mounted, based on results of the recognition of the component-sucking condition, the circuit-formed substrate-securing condition, and the position and inclination of the individual substrate; and making necessary correction of the component based on the result of the above calculation, and mounting the component at a predetermined position on the individual substrate, and the invention is characterized in that a position at which a substrate-recognition camera should recognize the position and inclination of the individual substrate is controlled based on the result of the recognition of the circuit-formed substrate-securing condition. This method is effective to avoid occurrence of a recognition error by utilizing the inclination of the circuit-formed substrate and the dislocation of the position thereof for the recognition operation of the individual substrate.

Another aspect of the present invention provides a method for mounting a component, which comprises steps of: recognizing a condition of a sucked component which is fed from a component-feeding unit, sucked and removed therefrom; recognizing a condition of a secured circuit-formed substrate which is carried, regulated and secured; recognizing a position and inclination of at least one individual substrate provided by sectioning the circuit-formed substrate; calculating correction amounts for a position and inclination of the component, which is to be mounted, based on results of recognition of the component-sucking condition, the circuit-formed substrate-securing condition, and the position and inclination of the individual substrate; and making necessary correction of the component based on the result of the above calculation, and mounting the component at a predetermined position on the individual substrate; and the invention is characterized in that, when a portion or a whole of a mark provided on the circuit-formed substrate so as to recognize the circuit-formed substrate-securing condition, or a mark provided on the individual substrate so as to recognize the condition of the individual substrate, is not included within a visual field of a substrate-recognition camera for recognizing these marks, a position of the mark is detected and the mark is again recognized. This method is effective to improve yield of non-defectives by detecting the position of the mark and again recognizing the same mark, even if a recognition error occurs.

Another aspect of the present invention is characterized in that a position of the mark is detected based on a portion of the mark captured within the visual field of the substrate-recognition camera, and that the mark is again recognized by moving the visual field of the substrate-recognition camera to this detected position.

Another aspect of the present invention is characterized in that a position of the mark is detected by enlarging the visual field of the substrate-recognition camera, and that the mark is again recognized.

Another aspect of the present invention provides a component-mounting apparatus which comprises: a component-feeding unit for feeding a component to be mounted; a mounting head for removing the component from the component-feeding unit and mounting it on a circuit-formed substrate; a component-recognition camera for recognizing a condition of the component when held by the mounting head; an X-Y robot for carrying the mounting head to a predetermined position; a circuit-formed substrate-securing device for carrying and securing the circuit-formed substrate; a substrate-recognition camera for recognizing a condition of the secured circuit-formed substrate; and a control unit for controlling overall operations of the apparatus. With the above construction, the substrate-recognition camera recognizes an individual substrate mark which is provided on each of at least one individual substrate provided by sectioning the circuit-formed substrate so as to recognize a position and inclination of the individual substrate; correction amounts for the position and inclination of the component to be mounted are calculated based on a result of this recognition of the individual substrate mark, a result of recognition of the component-holding condition performed by the component-recognition camera, and a result of the recognition of the circuit-formed substrate-securing condition performed by the substrate-recognition camera so as to make necessary correction of the component; and the mounting head is carried by the X-Y robot so as to mount the component at a predetermined position on the individual substrate; and the invention is characterized in that a bad mark to be indicated when the circuit-formed substrate includes a defective individual substrate is put on an individual substrate mark of the defective individual substrate so that the substrate-recognition camera can recognize the bad mark at the same time when recognizing the individual substrate mark. Use of this apparatus is effective to improve efficiency of a recognition operation by using the individual substrate mark also as the bad mark.

Another aspect of the present invention provides a component-mounting apparatus which comprises: a component-feeding unit for feeding a component to be mounted; a mounting head for removing the component from the component-feeding unit and mounting it on a circuit-formed substrate; a component-recognition camera for recognizing a condition of the component when held by the mounting head; an X-Y robot for carrying the mounting head to a predetermined position; a circuit-formed substrate-securing device for carrying and securing the circuit-formed substrate; a substrate-recognition camera for recording and recognizing a condition of the secured circuit-formed substrate; and a control unit for controlling overall operations of the apparatus. With the above construction, the substrate-recognition camera recognizes an individual substrate mark which is provided on each of at least one individual substrate provided by sectioning the circuit-formed substrate so as to recognize a position and inclination of the individual substrate; correction amounts for a position and inclination of the component to be mounted are calculated based on a result of the recognition of the individual substrate mark, a result of recognition of the component-holding condition by the component-recognition camera, and a result of recognition of the circuit-formed substrate-securing condition by the substrate-recognition camera so as to make necessary correction of the component; and the mounting head is carried by the X-Y robot so as to mount the component at a predetermined position on the individual substrate; and the invention is characterized in that a position at which the substrate-recognition camera should recognize the individual substrate mark is controlled based on the result of the recognition of the circuit-formed substrate-securing condition. This apparatus makes it possible to avoid such a situation that the individual substrate mark is not recognized at all, as much as possible, by controlling a position of the substrate-recognition camera based on the result of the recognition of the position and inclination of the circuit-formed substrate.

Another aspect of the present invention provides a component-mounting apparatus which comprises a component-feeding unit for feeding a component to be mounted; a mounting head for removing the component from the component-feeding unit and mounting it on a circuit-formed substrate; a component-recognition camera for recognizing a condition of the component when held by the mounting head; an X-Y robot for carrying the mounting head to a predetermined position; a circuit-formed substrate-securing device for carrying and securing the circuit-formed substrate; a substrate-recognition camera for recording and recognizing a condition of the secured circuit-formed substrate; and a control unit for controlling overall operations of the apparatus. With the above construction, the substrate-recognition camera recognizes an individual substrate mark which is provided on each of at least one individual substrate provided by sectioning the circuit-formed substrate so as to recognize a position and inclination of the individual substrate; correction amounts for a position and inclination of the component to be mounted are calculated based on a result of recognition of the individual substrate mark, a result of recognition of the component-holding condition by the component-recognition camera, and the result of the recognition of the circuit-formed substrate-securing condition performed by the substrate-recognition camera so as to make necessary correction of the component; and the mounting head is carried by the X-Y robot so as to mount the component at a predetermined position on the individual substrate; and the invention is characterized in that, when a portion or a whole of a reference mark provided on the circuit-formed substrate for recognizing the circuit-formed substrate-securing condition, or an individual substrate mark, is not included within a visual field of the substrate-recognition camera, the substrate-recognition camera detects a position of the mark and again recognizes the same mark.

Another aspect of the present invention is characterized in that a position of the mark is detected based on a portion of the mark captured within the visual field of the substrate-recognition camera, and that the mark is again recognized by moving the visual field of the substrate-recognition camera to this detected position.

Another aspect of the present invention is characterized in that a position of the mark is detected by enlarging a visual field of the substrate-recognition camera, and that the detected mark is again recognized.

DETAILED DESCRIPTION OF THE PREFERRED EMBODIMENTS

The present invention is described in detail by way of the following embodiments, which should not be construed as limiting the scope of the present invention in any way.

A component-mounting apparatus and a component-mounting method according to a first embodiment of the present invention are described with reference to the accompanying drawings.

Figure 1A:
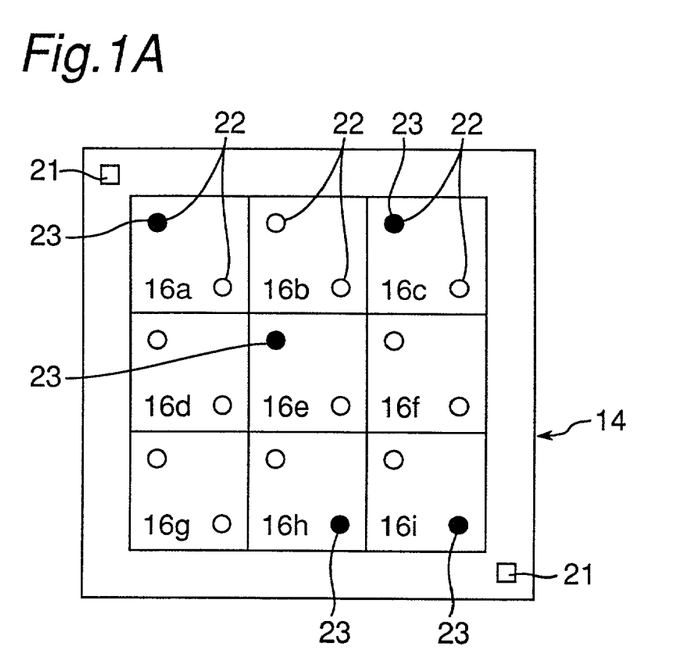
FIGS. 1A and 1B are plan views of a circuit-formed substrate according to an embodiment of the present invention.
Figure 1B:
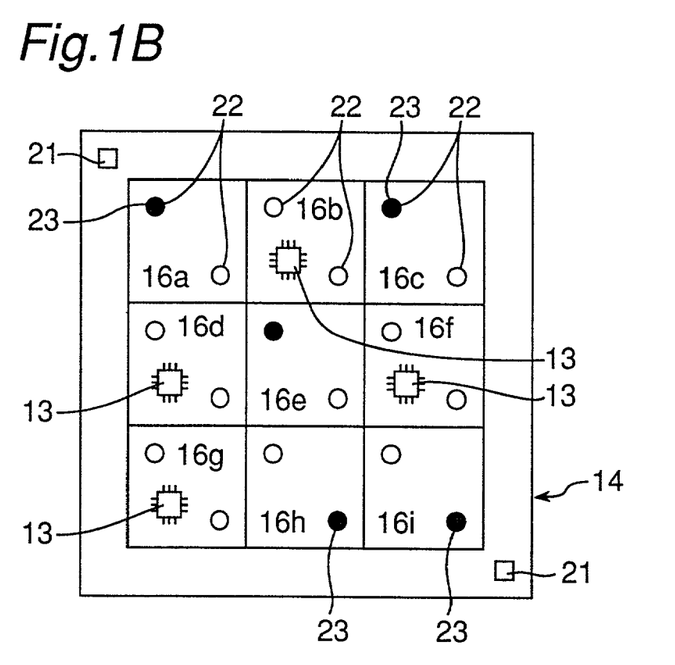

FIGS. 1A and 1B show a circuit-formed substrate (14) and recognition marks (21, 22, 23) according to the present embodiment. In this connection, like components or components in the present embodiment and following embodiments are denoted by the same reference numbers or notations. Components which are not included in the description of the present embodiment and the following embodiments are the same ones included in the conventional component-mounting apparatus and the conventional component-mounting method.

In FIGS. 1A and 1B, a pair of reference marks (21) are provided on a diagonal line of the circuit-formed substrate (14), and individual substrate marks (22) are provided on individual substrates (16a) to (16i), respectively. This constitution is the same as that of the conventional apparatus.

The circuit-formed substrate (14) according to the present invention has no special position for a bad mark, and individual substrate mark (22) is used also as a position on which a bad mark should be put. In detail, the individual substrate mark (22) is used to recognize a condition of each individual substrate (16) as in the conventional apparatus, and simultaneously used as a position on which an operator or a machine will color or apply a bad mark when finding a defective factor such as incorrect mounting or non-mounting of a component on each individual substrate (16) in the course of the above recognition step.

FIG. 1A shows such a situation in which bad marks (23) are put on individual substrates (16a, 16c, 16e, 16h, 16i) because some defective factors are found in these substrates. Bad mark (23) may be put on either of two individual substrate marks (22) of each individual substrate (16). Based on a result of recognition of these bad marks (23) by a substrate-recognition camera (15), components (13) are mounted on only individual substrates (16b, 16d, 16f, 16g) on which the bad marks (23) are not applied, but not on the individual substrates (16) on which the bad marks (23) are applied. The individual substrates (16) on which the components are mounted and the individual substrates (16) on which the components are not mounted will be grouped later into non-defectives and defectives, respectively.

Figure 2:
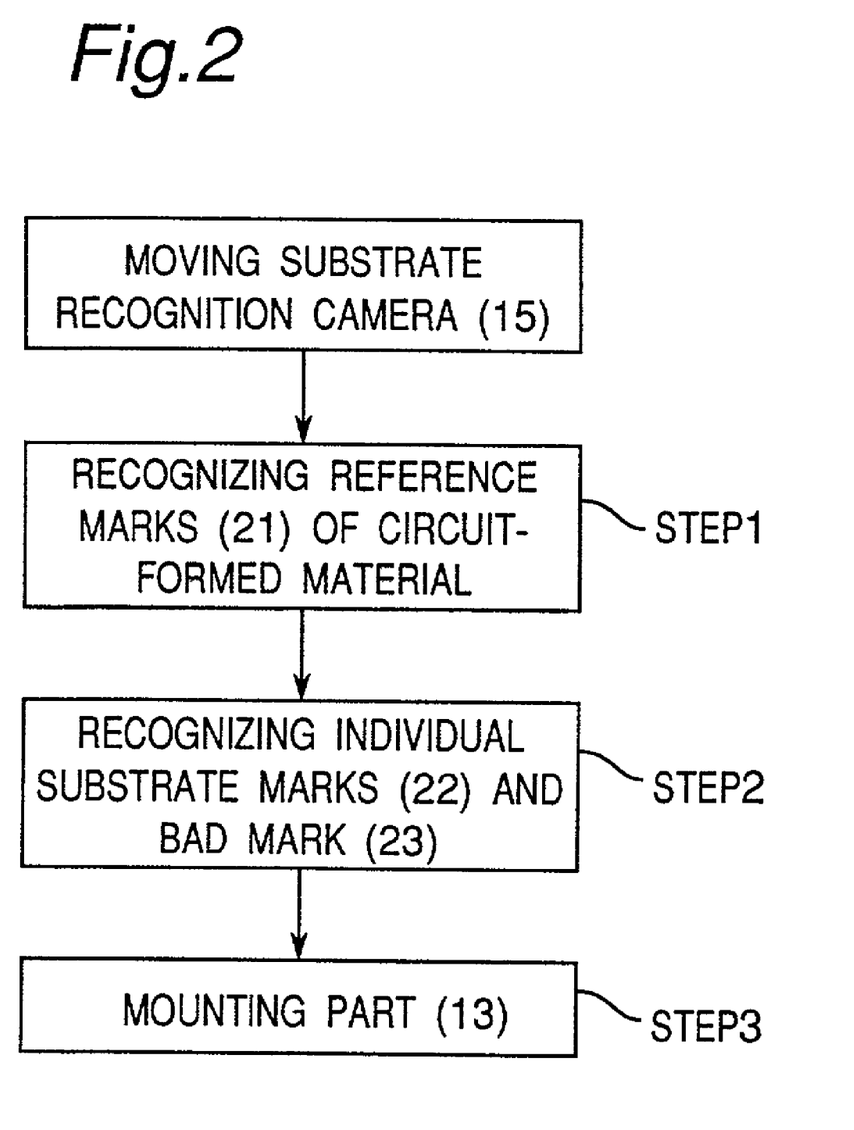
FIG. 2 is an operational flowchart of a process of recognition of the circuit-formed substrate shown in FIG. 1.

FIG. 2 shows a flowchart for a recognition operation by the substrate-recognition camera (15). In FIG. 2, the substrate-recognition camera (15) moved to a position facing the circuit-formed substrate (14) in accordance with movement of a mounting head (4), first, records and recognizes images of a pair of reference marks (21) on the circuit-formed substrate (14) at Step 1, and an inclination of the circuit-formed substrate (14) as a whole, and dislocation of a position thereof, are measured based on this recognition. Next, the substrate-recognition camera (15) sequentially recognizes two individual substrate marks (22) on each of the individual substrates (16) at Step 2. As mentioned above, bad marks (23) are previously put on the individual substrate marks (22) of the individual substrates (16) having some defective factors. Therefore, at Step 2, not only conditions of the individual substrates (16) but also the bad marks (23) of the individual substrates (16) having some defective factors are concurrently recognized so as to distinguish non-defectives from defectives. Of the individual substrates (16) having no bad mark (23) found, positions of components (13) and correction amounts for their inclination are calculated based on a result of recognition of the individual substrate marks (22), and then, the components (13) are mounted on predetermined positions of the individual substrates at Step 3.

In the above conventional apparatus, the recognition operation of the bad marks (23) and the recognition operation of the individual substrate marks (22) are separately performed as described above. In contrast, according to the present embodiment, it becomes possible to save all time required for a recognition operation for the bad marks (23), which leads to large time reduction. Further, a defective individual substrate (16) can be discriminated at once if a bad mark (23) is put on either of the pair of individual substrate marks (22) which has been found earlier in one individual substrate (16), and a recognition operation for the other individual substrate mark (22) becomes unnecessary, which leads to a further reduction of tact time. In this regard, although the present embodiment is described as using one circuit-formed substrate which is sectioned for a plurality of individual substrates (16), it is also possible to apply the present embodiment to one circuit-formed substrate provided for a single individual substrate. In this case, the reference marks (21) of the circuit-formed substrate can be used as individual substrate marks (22).

Figure 3:
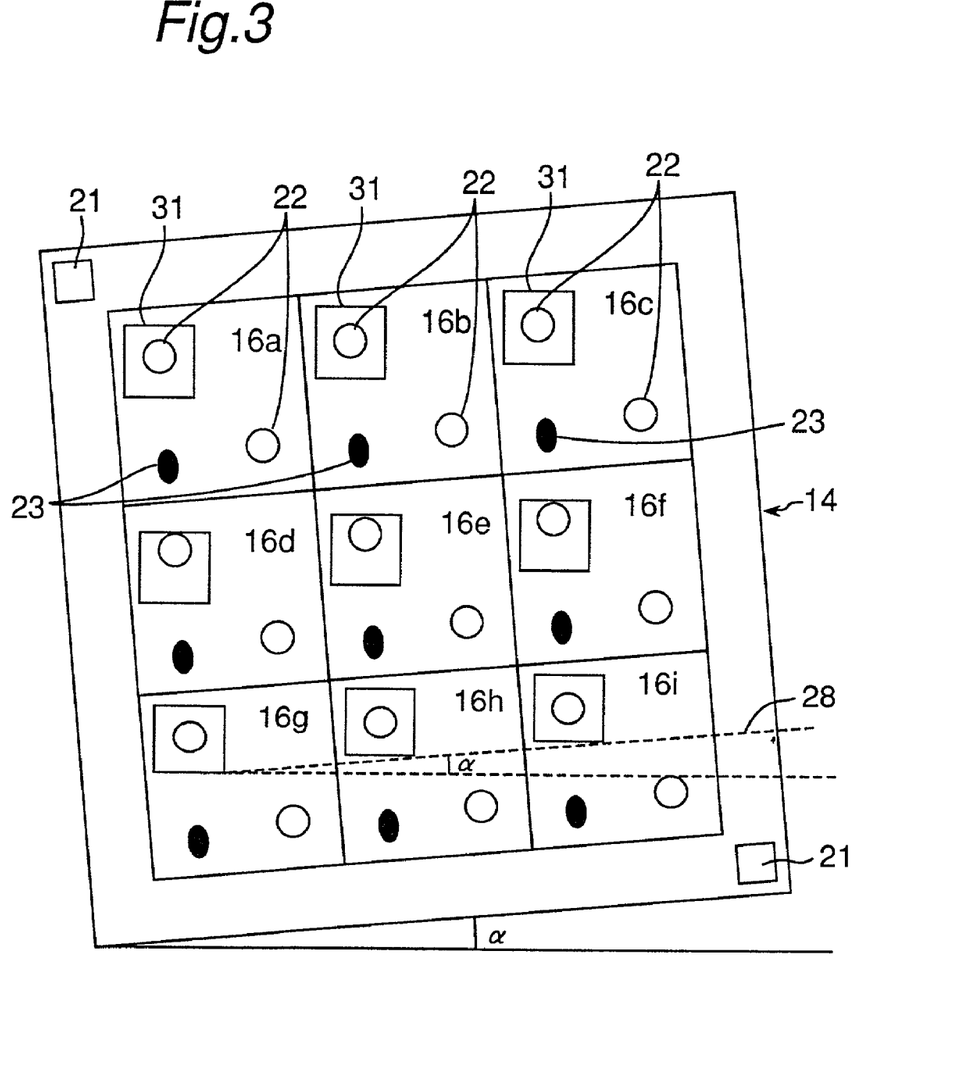
FIG. 3 is a plan view of a circuit-formed substrate according to another embodiment of the present invention, illustrating a process of recognition thereof.

Next, a component-mounting apparatus and a component-mounting method according to a second embodiment of the present invention are described with reference to the accompanying drawings. As has been already described with reference to FIG. 9 for the conventional apparatus, when inclination of the circuit-formed substrate (14) and dislocation of a position thereof are recognized by a recognition operation for reference marks (21) of the circuit-formed substrate (14), results of this recognition are reflected on only correction of inclination of a component (13) to be mounted and a position of the component (13). If the inclination of the circuit-formed substrate (14) is large, individual substrate marks (22) are not included within visual field (31) of substrate-recognition camera (15), which disadvantageously becomes a factor for a recognition error. FIG. 3 illustrates a recognition operation for circuit-formed substrate (14) according to the present embodiment. In FIG. 3, the circuit-formed substrate (14) is supposed to incline an angle of α relative to a normal condition shown in this figure as a result of recognition of reference marks (21) of the circuit-formed substrate (14) by substrate-recognition camera (15). In the present embodiment, this recognition result reflects on not only correction amounts for an inclination and position of component (13) but also a recognition operation for bad marks (23) by the substrate-recognition camera (15) (see Step 52 in FIG. 8), and a recognition operation for individual substrate marks (22) by the substrate-recognition camera (15) (see Step 53 in FIG. 8) at a next step.

Thus, as indicated by broken line (28) in FIG. 3, when recognizing the individual substrate marks (22), the substrate-recognition camera (15) moves to a position which is predetermined by reflecting inclination α of the circuit-formed substrate (14), so as to perform a recognition operation for each of individual substrates (16). Therefore, the individual substrate marks (22) can be easily captured within visual field (31) of the substrate-recognition camera (15). This avoids a recognition error relative to individual substrate mark (22), and further a misjudgment of a non-defective individual substrate as a defective based on such a recognition error. Thus, a component is mounted on a predetermined position of each individual substrate (16). That is, reflecting the recognition result of the circuit-formed substrate (14) on the recognition operations for the bad marks (23), and also the individual substrate marks (22) by the substrate-recognition camera (15), leads to an improvement of yield of non-defectives and also to an increase in production efficiency of the component-mounting process.

Since it becomes easy to avoid a recognition error by the substrate-recognition camera (15), it becomes possible to further narrow the visual field of the substrate-recognition camera (15), which provides a possibility to reduce a tact time for a recognition operation in association with an improvement of resolution. Since many recognition operations are required for bad marks (23) and individual substrate marks (22) of one circuit-formed substrate (14), further reduction of tact time by narrowing the visual field of the camera is particularly effective for a circuit-formed substrate which is sectioned for far more individual substrates.

Although FIG. 3 shows the conventional circuit-formed substrate (14) which separately provides the bad marks (23) on the respective individual substrates (16), the bad marks (23) may be eliminated and the individual substrate marks (22) may be used also as the bad marks (23) as described in the component of the first embodiment.

Figure 4A:
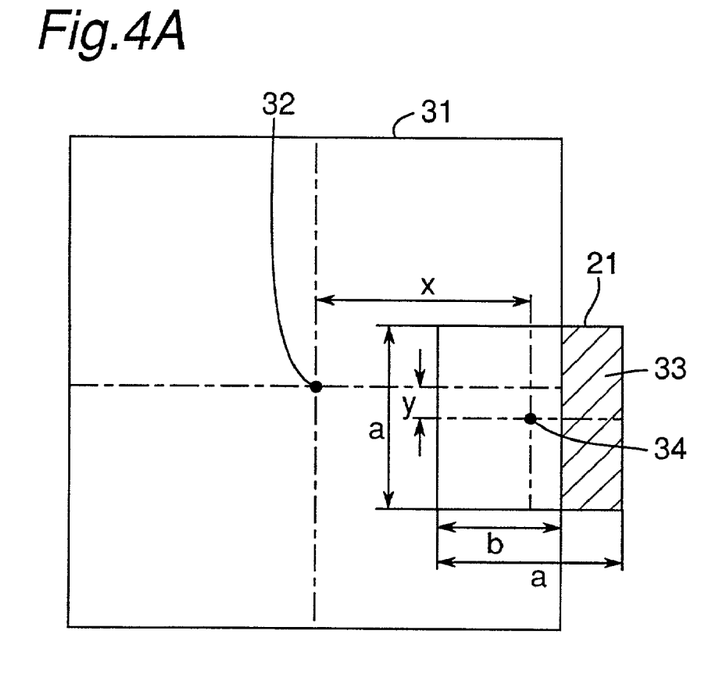
FIGS. 4A and 4B are plan views of a circuit-formed substrate according to yet another embodiment of the present invention, illustrating a process of recognition thereof.

Next, a component-mounting apparatus and a component-mounting method according to a third embodiment of the present invention are described with reference to the accompanying drawings. In FIG. 4A, visual field (31) of substrate-recognition camera (15) is formed as a substantially right square around center (32) of the camera. When reference mark (21) of circuit-formed substrate (14) is recognized by such a substrate-recognition camera (15), the reference mark (21) in its entirety is generally required to be included within the visual field (31). If a component of the reference mark (21) (hatched portion (33)) is excluded from the visual field (31) as shown in FIG. 4A, the conventional component-mounting apparatus would judge it as a recognition error. Since it is impossible to calculate a correction amount for a position of the circuit-formed substrate (14) so as to perform following component-mounting, such a circuit-formed substrate is scrapped as a defective. Also, individual substrate (16) is scrapped in the same manner as a defective if a recognition error is found in the individual substrate mark (22).

On the other hand, where even a component of the reference mark (21) of the circuit-formed substrate (14) is included within the visual field (31) in the present embodiment, a position of the reference mark (21) is detected based on such a component of the reference mark (21). In an example shown in FIG. 4A, length "a" of one side of the reference mark (21) is known from a shape of the reference mark (21), known in advance, and it is possible to measure length "b" of a component of a side captured within the visual field (31), based on which the portion (the hatched portion (33)) of the reference mark (21) excluded from the visual field (31) of the substrate-recognition camera (15) can be estimated. Therefore, it is also possible to estimate a position of center (34) of the reference mark (21), so that it becomes possible to calculate "x" and "y" as amounts of dislocation between this center (34) and the center (32) of the substrate-recognition camera (15).

Figure 4B:
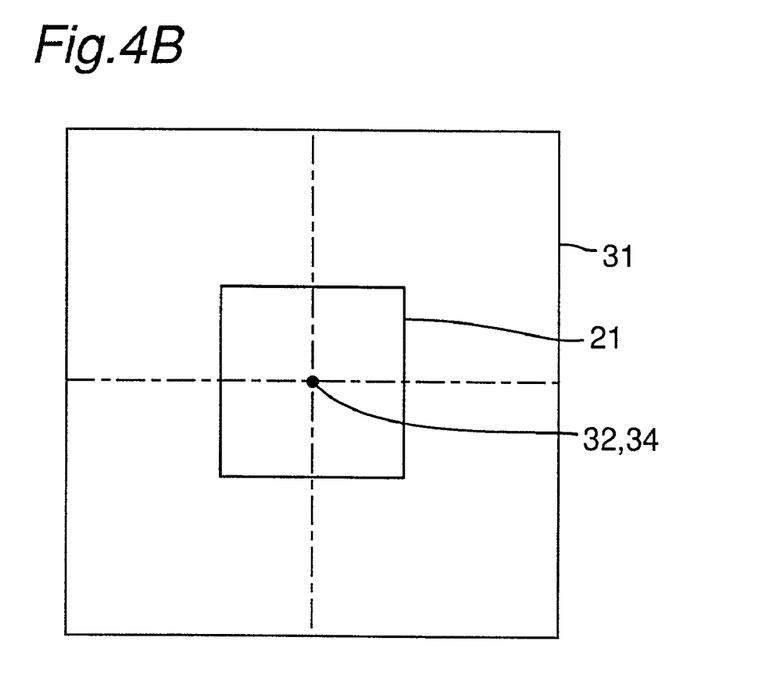

In the present embodiment, as described above, recognition of only a component of the reference mark (21) during a first recognition operation is not judged as a recognition error, and the position of the reference mark (21) is detected and the amounts "x" and "y" of dislocation of the center position are calculated. Next, positioning of the substrate-recognition camera (15) is again performed by taking into account the above calculated dislocation amounts, and then, a second recognition operation is performed. By doing so, the reference mark (21) is set around the center (32) of the visual field (31) as shown in FIG. 4B. Widening the visual field of the substrate-recognition camera (15) to reduce a number of recognition errors leads to an increase in tact time required for all recognition operations, resulting in a lower production efficiency. In the above method according to the present embodiment, it is sufficient to perform the second recognition operation, aiming at only the reference mark (21) which would be conventionally judged as a recognition error. Thus, the above mentioned time loss caused by widening the visual field can be avoided, and efficiency of a recognition operation is improved.

Although square marks are employed in the drawings, it is easy to detect a center position of a mark to be recognized if such a mark has a shape of circle, triangle or the like, provided that the shape of this mark is previously known. Further, such detection of a mark can be applied to not only the reference mark (21) but also the individual substrate marks (22).

Figure 5:
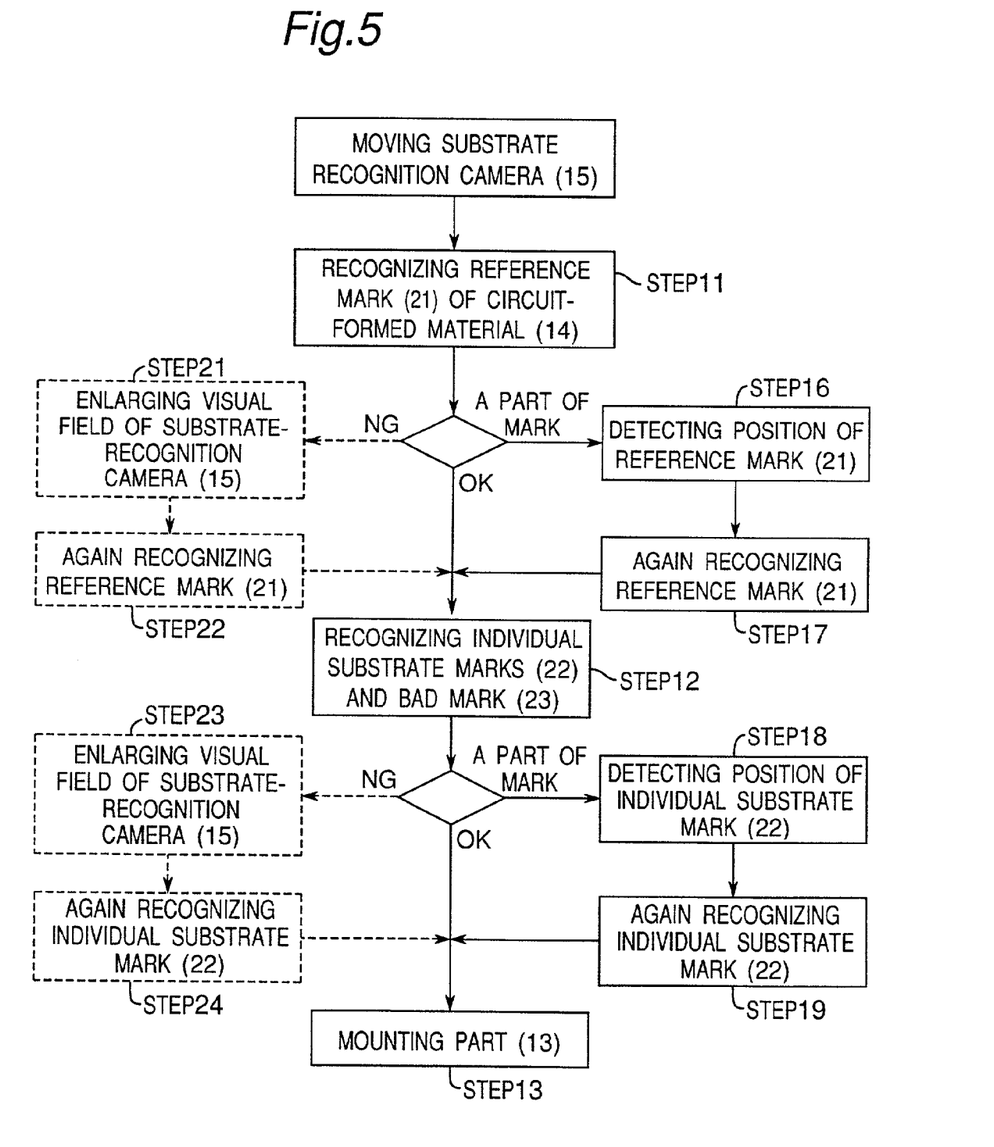
FIG. 5 is an operational flowchart of a process of recognition of the circuit-formed substrate shown in FIGS. 4A and 4B.

FIG. 5 shows a flowchart of the recognition operation by the substrate-recognition camera (15) according to the present embodiment. In FIG. 5, the substrate-recognition camera (15) moved to a position facing the circuit-formed substrate (14) in accordance with movement of the mounting head (4), first recognizes the reference mark (21) of the circuit-formed substrate (14) at Step 11. If normally recognizing the reference mark (21) at Step 11, the substrate-recognition camera (15) sequentially recognizes the individual substrate marks (22) of all the individual substrates (16) on a plurality of sections of the circuit-formed substrate (14) at Step 12. During this recognition operation, conditions of the individual substrates (16) and discrimination of non-defectives from defectives thereof are recognized depending on presence or absence of bad marks (23) described in the component of the first embodiment. If the individual substrate mark (22) can be normally recognized at Step 12, correction amounts for inclination of the component (13) and position thereof are calculated based on recognition results at Steps 11 and 12. Then, the component (13) is mounted on a predetermined position at Step 13.

If only a component of the reference mark (21) of the circuit-formed substrate (14) is recognized at Step 11, the program goes to Step 16, at which a position of the reference mark (21) is detected and a dislocation amount from the substrate-recognition camera (15) is calculated. The substrate-recognition camera (15) moves based on a result of this calculation and performs the second recognition operation relative to the reference mark (21) at Step 17. If a normal recognition operation is performed at Step 17, the program goes to Step 12, and then, the component-mounting operation is performed following the above-mentioned flowchart.

If only a component of the individual substrate mark (22) is recognized at Step 12, the program goes to Step 18, at which a position of the individual substrate mark (22) is detected and an amount of dislocation from the substrate-recognition camera (15) is calculated. The substrate-recognition camera (15) moves based on a result of this calculation and performs the second recognition operation relative to the individual substrate mark (22) at Step 19. When a normal recognition operation is performed at this step, necessary correction for the component is performed in the same manner as above, and the component-mounting operation is performed at Step 13.

Operational flows indicated by broken lines on the left side of FIG. 5 optionally can be provided. In other words, even if the reference mark (21) of the circuit-formed substrate (14) cannot be recognized at all, it is supposed that the reference mark (21) should be in the vicinity of the visual field (31). Therefore, the visual field (31) of the substrate-recognition camera (15) is enlarged at Step 21 and the second recognition operation is performed at Step 22. Time required for the recognition operation becomes longer in a case where the visual field is widened. However, this is done for only a circuit-formed substrate (14) in an abnormal condition under which the reference mark (21) cannot be recognized at all. It is considered that, in some cases, it is more economically advantageous to again recognize such a circuit-formed substrate (14) by enlarging the visual field of the camera rather than to scrap this circuit-formed substrate (14) as a defective. If the reference mark (21) can be normally recognized by widening the visual field, the program returns to Step 12 and proceeds according to normal operational flow. In this regard, in a case where only a component of the reference mark (21) is recognized even after the visual field is enlarged at Step 21, the operations described at Steps 16 and 17 may be again repeated; that is, a position of the mark is detected, and the reference mark is again recognized.

Similarly, in a case where the individual substrate mark (22) cannot be recognized at all during a recognition operation for the individual substrate mark (22) at Step 12, the program optionally may proceed to Step 23 to enlarge the visual field of the substrate-recognition camera (15) and again recognize the individual substrate mark (22) at Step 27. However, in this case, it is only one individual substrate (16) that can be remedied, and thus, cost-effectiveness is relatively small as compared with a case where the circuit-formed substrate (14) in its entirety is remedied at Step 21. When the individual substrates (22) have been recognized by operation of the above re-recognition, the program proceeds to Step 13 to correct an inclination and position of the component (13) and mount it at a predetermined position.

The flowchart for the recognition operation shown in FIG. 5 is made for concurrent recognition of the individual substrate mark (22) and the bad mark (23) at Step 12. However, the individual substrate mark (22) and the bad mark (23) may be separately recognized as in the conventional apparatus. Otherwise, it is desirable that, as in the second embodiment, after recognition of the reference mark (21) at Step 11, a result of this recognition is utilized to correct a position of the substrate-recognition camera (15) in the course of recognizing the individual substrate mark (22) at Step 12.

The foregoing descriptions have been made for the component-mounting methods and the component-mounting apparatuses according to the embodiments of the present invention in which a plurality of individual substrates are provided from one circuit-formed substrate. However, as referred to in the component of the first embodiment, the scope of the present invention is not limited to the above circuit-formed substrate from which a plurality of individual substrates are provided. The present invention also can be applied to a single substrate provided from one circuit-formed substrate.

According to the component-mounting apparatuses and the component-mounting methods of the present invention, it is possible to decrease a number of the recognition steps for the marks of a single or a plurality of individual substrate(s) provided from a circuit-formed substrate, and thus to save tact time required for the recognition process and to improve production efficiency.

Further, according to the component-mounting apparatuses and the component-mounting methods of the present invention, it is possible to reduce a rate of causing recognition errors, and also it is possible to remedy a circuit-formed substrate or individual substrates which are conventionally scrapped as defectives and to provide them as non-defectives. Therefore, yield of non-defectives obtained in the course of mounting components can be improved.

Further, according to the component-mounting apparatuses and the component-mounting methods of the present invention, since it is possible to reduce the rate of causing recognition errors, resolution of the substrate-recognition camera can be improved by narrowing the visual field of the camera, so that tact time required for the recognition process can be reduced, which leads to higher production efficiency.

It should be noted that this application is based upon Japanese Patent Application No. 2000-374428, which is entirely incorporated herein by reference.

What is claimed is:

1. A method for mounting a component, comprising:
    recognizing a bad mark indicated on a circuit-formed substrate when individual substrates, provided by sectioning said circuit-formed substrate, include at least one defective individual substrate;
    recognizing an individual substrate mark, provided on said circuit-formed substrate, so as to recognize a position and inclination of said individual substrates; and then
    mounting a component on one of said individual substrates other than said at least one defective individual substrate,
    wherein said bad mark is indicated on said individual substrate mark.

2. A method for mounting a component, comprising:
    recognizing a condition of a component after said component has been fed by a component-feeding device, sucked and removed from said component-feeding device, and while said component remains sucked, thereby providing a recognized condition of said component;
    recognizing a condition of a circuit-formed substrate which is supported, regulated and secured, thereby providing a recognized condition of said circuit-formed substrate;
    using a mark on at least one individual substrate, provided by sectioning said circuit-formed substrate, to recognize a position and inclination of said at least one individual substrate, thereby providing a recognized position and inclination of said at least one individual substrate;

calculating correctional amounts for a position and inclination of said component based on said recognized condition of said component, said recognized condition of said circuit-formed substrate, and said recognized position and inclination of said at least one individual substrate, thereby providing calculated correctional amounts;

performing any necessary correction of said component based on said calculated correctional amounts; and then if said mark is recognized as a good mark, mounting said component at a predetermined position on said at least one individual substrate, wherein a location of said mark on said at least one individual substrate is to be used as a location of a bad mark for identifying said at least one individual substrate as a defective individual substrate when said at least one individual substrate is judged as a defective individual substrate.

3. The method according to claim 2, further comprising:
when said at least one individual substrate is judged as a defective individual substrate, indicating said bad mark by coloring said mark on said at least one individual substrate such that mounting of said component on said at least one individual substrate is not performed.

4. A component-mounting apparatus comprising:
a component-feeding unit for feeding a component;
a mounting head for removing the component from said component-feeding unit, holding the component, and mounting the component onto a circuit-formed substrate;
a component-recognition camera for recognizing a condition of the component while held by said mounting head;
an X-Y robot for carrying said mounting head to a predetermined position;
a circuit-formed substrate-securing device for supporting and securing the circuit-formed substrate;
a substrate-recognition camera for recognizing a condition of the circuit-formed substrate when supported and secured by said circuit-formed substrate-securing device; and
a control unit for controlling overall operations of the apparatus such that
  (i) said substrate-recognition camera recognizes an individual substrate mark provided on at least one individual substrate, provided by sectioning the circuit-formed substrate, so as to recognize a position and inclination of the at least one individual substrate;
  (ii) correctional amounts for a position and inclination of the component are calculated based on the position and inclination of the at least one individual substrate as recognized by said substrate-recognition camera, the condition of the component while held by said mounting head as recognized by said component-recognition camera, and the condition of the circuit-formed substrate when supported and secured by said circuit-formed substrate-securing device as recognized by said substrate-recognition camera, so as to make any necessary correction of the component, and
  (iii) said mounting head is carried by said X-Y robot so as to mount the component at a predetermined position on the at least one individual substrate,
wherein said substrate recognition camera is also for recognizing a bad mark indicated on an individual substrate mark of a defective individual substrate, when the circuit-formed substrate includes the defective individual substrate, while recognizing the individual substrate mark of the defective individual substrate.

* * * * *